United States Patent
Huang et al.

(10) Patent No.: US 9,484,859 B2
(45) Date of Patent: Nov. 1, 2016

(54) MODULATION CIRCUIT AND OPERATING METHOD THEREOF

(71) Applicant: MEDIATEK Inc., Hsin-Chu (TW)

(72) Inventors: Yen Lin Huang, Zhubei (TW); Hsiang-Hui Chang, Miaoli (TW); Hsin-Hung Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/919,847

(22) Filed: Oct. 22, 2015

(65) Prior Publication Data

US 2016/0126892 A1 May 5, 2016

Related U.S. Application Data

(60) Provisional application No. 62/075,368, filed on Nov. 5, 2014, provisional application No. 62/075,370, filed on Nov. 5, 2014.

(51) Int. Cl.
| | |
|---|---|
| *H03L 7/197* | (2006.01) |
| *H03C 3/09* | (2006.01) |
| *H03C 3/20* | (2006.01) |
| *H03L 7/093* | (2006.01) |
| *H03L 7/099* | (2006.01) |
| *H02M 3/07* | (2006.01) |
| *H03B 5/12* | (2006.01) |
| *H03L 7/08* | (2006.01) |
| *H03L 7/10* | (2006.01) |

(52) U.S. Cl.
CPC .............. *H03C 3/20* (2013.01); *H02M 3/07* (2013.01); *H03B 5/124* (2013.01); *H03B 5/1212* (2013.01); *H03C 3/0925* (2013.01); *H03C 3/0941* (2013.01); *H03C 3/0958* (2013.01); *H03L 7/0802* (2013.01); *H03L 7/093* (2013.01); *H03L 7/099* (2013.01); *H03L 7/104* (2013.01); *H03L 7/1976* (2013.01)

(58) Field of Classification Search
CPC  H03C 3/0908; H03C 3/0916; H03C 3/0925; H03C 3/0941; H03C 3/0958; H03L 7/08; H03L 7/0992; H03L 7/104; H03L 7/18; H03L 7/1976
USPC ............ 327/147, 156; 331/23; 332/127, 128
See application file for complete search history.

(56) References Cited

U.S. PATENT DOCUMENTS

| | | | |
|---|---|---|---|
| 6,700,447 B1 * | 3/2004 | Nilsson ................ | H03C 3/0925 331/1 A |
| 7,453,325 B2 | 11/2008 | Hammes et al. | |
| 7,522,011 B2 * | 4/2009 | Matero ................ | H03C 3/0925 331/16 |
| 7,612,617 B2 | 11/2009 | Pullela et al. | |
| 7,672,645 B2 * | 3/2010 | Kilpatrick ............ | H04B 1/0483 455/102 |
| 8,022,782 B2 | 9/2011 | Ahn | |
| 8,049,540 B2 | 11/2011 | Shanan | |

(Continued)

*Primary Examiner* — Levi Gannon
(74) *Attorney, Agent, or Firm* — McClure, Qualey & Rodack, LLP

(57) ABSTRACT

A modulation circuit includes a phase locked loop (PLL) circuit, a scalar circuit and a sigma-delta modulator. The PLL circuit is for generating an output oscillating signal in response to a reference signal, a first control signal and a second control signal. The scalar circuit is for generating the first control signal in response to modulating data to control frequency deviation of the output oscillating signal, wherein the first control signal is in a digital form. The sigma-delta modulator is for generating the second control signal according to the modulating data to modulate a divider value of a frequency divider of the PLL circuit.

19 Claims, 7 Drawing Sheets

(56) References Cited

U.S. PATENT DOCUMENTS

| | | |
|---|---|---|
| 8,076,960 B2 | 12/2011 | Geng et al. |
| 8,427,243 B2 * | 4/2013 | Chen .................. H03C 3/0925 327/156 |
| 8,531,244 B2 * | 9/2013 | Shibata ................ H03L 7/0891 327/156 |
| 2006/0197605 A1 * | 9/2006 | Hirano ................ H03C 3/0925 331/16 |
| 2007/0060090 A1 * | 3/2007 | Wagner .................... H03L 7/10 455/260 |
| 2007/0252654 A1 * | 11/2007 | Beyer .................. H03C 3/0925 331/16 |
| 2008/0074208 A1 * | 3/2008 | Lee ...................... H03C 3/0925 332/127 |
| 2009/0195275 A1 * | 8/2009 | Friedman ................ H03L 7/08 327/156 |
| 2012/0013375 A1 * | 1/2012 | Kuramochi .......... H03C 3/0925 327/156 |
| 2014/0320184 A1 * | 10/2014 | Chen .................... H03L 7/0891 327/157 |
| 2015/0263670 A1 * | 9/2015 | Fan ...................... H03B 5/1206 331/117 R |

\* cited by examiner

MODULATION CIRCUIT AND OPERATING METHOD THEREOF

This application claims the benefits of U.S. provisional patent application No. 62/075,368, filed Nov. 5, 2014 and No. 62/075,370, filed Nov. 5, 2014, the disclosures of which are incorporated by reference herein in its entirety.

TECHNICAL FIELD

The disclosure relates in general to a modulation circuit and an operating method thereof.

BACKGROUND

Two-point modulation technique is widely used in telecommunications and avoids an issue of limited bandwidth of a phase-locked loop (PLL) by an approach of splitting the modulating data into two parts: one is transmitted to the voltage-controlled oscillator (VCO), and the other one is to the delta-sigma modulator (SDM). However, a two-point modulator requires a digital to analog converter (DAC) and/or other circuits at the input of the VCO to convert the modulating data into an analog form, and hence the power consumption of the device is increased. Moreover, the gain mismatching between two modulation paths causing signal distortion is another issue.

Therefore, there is a need to provide a simple, low power, low cost and self-calibration modulation circuit and operating method thereof.

SUMMARY

The disclosure is directed to a modulation circuit and an operating method thereof.

According to one embodiment, a modulation circuit is provided. The modulation circuit includes a phase locked loop (PLL) circuit, a scalar circuit and a sigma-delta modulator. The PLL circuit is for generating an output oscillating signal in response to a reference signal, a first control signal and a second control signal. The scalar circuit is for generating the first control signal in response to modulating data to control frequency deviation of the output oscillating signal, wherein the first control signal is in a digital form. The sigma-delta modulator is for generating the second control signal according to the modulating data to modulate a divider value of a frequency divider of the PLL circuit.

According to another embodiment, an operating method of a modulation circuit is provided. The operating method includes steps of: generating, by a phase locked loop (PLL) circuit, an output oscillating signal in response to a reference signal, a first control signal and a second control signal; generating, by a scalar circuit coupled to the PLL circuit, the first control signal in response to modulating data to control frequency deviation of the output oscillating signal, wherein the first control signal is in a digital form; and generating, by a sigma-delta modulator, the second control signal according to the modulating data to modulate a divider value of a frequency divider of the PLL circuit.

Figure 1:
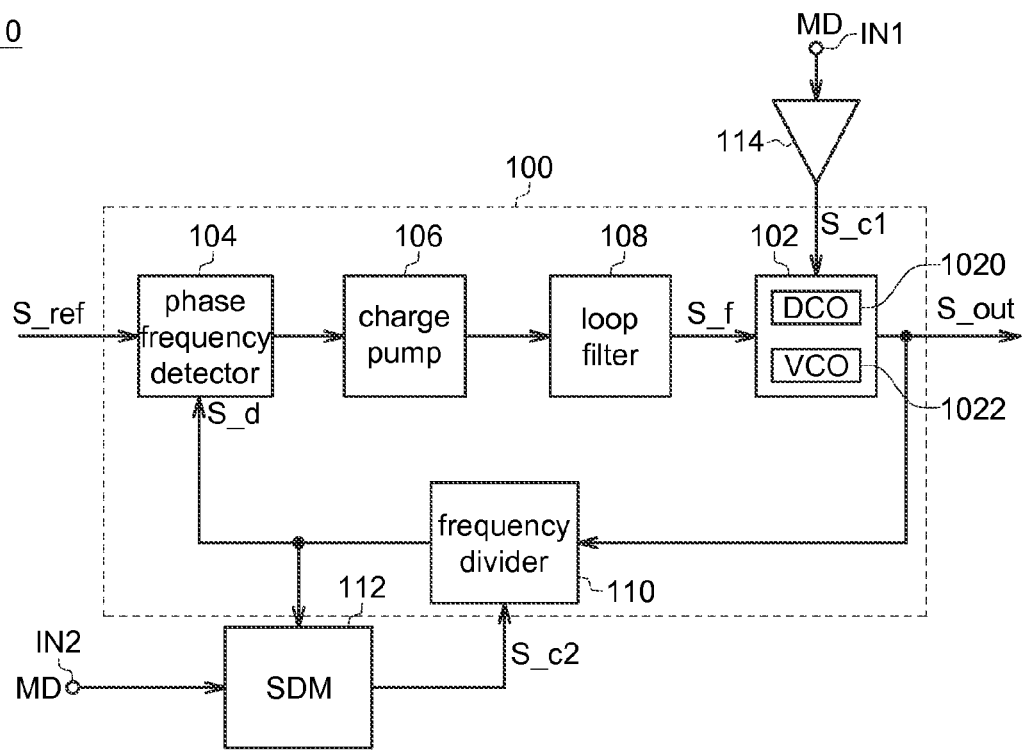
FIG. 1 illustrates a modulation circuit according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a modulation circuit 10 according to an embodiment of the present disclosure. The modulation circuit 10 can be used in a transmitter that adopts two-point modulation architecture, which may provide frequency modulation for various modulation formats. As illustrated in FIG. 1, the modulation circuit 10 receives modulating data MD via a first input IN1 and a second input IN2, and generates an output oscillating signal S_out. The modulating data MD from the first input IN1 is converted into a first control signal S_c1, and the modulating data MD from the second input IN2 is converted into a second control signal S_c2.

The modulation circuit 10 comprises a phase locked loop (PLL) circuit 100, a sigma-delta modulator (SDM) 112 and a scalar circuit 114. The PLL circuit 100 generates the output oscillating signal S_out in response to a reference signal S_ref, the first control signal S_c1 and the second control signal S_c2. The scalar circuit 114 is coupled to the PLL circuit 100, and generates the first control signal S_c1 in response to the modulating data MD to control frequency deviation of the output oscillating signal S_out. The SDM 112 generates the second control signal S_c2 according to the modulating data MD to modulate a divider value of a frequency divider 110 of the PLL circuit 100.

The PLL circuit 100 includes an oscillating module 102, a phase frequency detector 104, a charge pump 106, a loop filter 108 and the frequency divider 110. The oscillating module 102 generates the output oscillating signal S_out in response to a filtered signal S_f from the loop filter 108 and the first control signal S_c1 from the scalar circuit 114. The oscillating module 102 includes a digital controlled oscillator (DCO) 1020 and a voltage controlled oscillator (VCO) 1022. The first control signal S_c1 controls the capacitance of the DCO 1020 to adjust the frequency of the output oscillating signal S_out. The VCO 1022 performs phase-locking in response to the filtered signal S_f.

In the embodiment, the first control signal S_c1 is in a digital form, which indicates an estimated tuning gain (Kd) of the oscillating module 102. The estimated tuning gain represents an estimated amount of frequency deviation that results from a unit-cell-change in the DCO 1020. For example, if the modulating data MD corresponds to a target frequency Ft, the first control signal S_c1 generated by the scalar circuit 114 can be specified by round[Ft/Kd], which indicates a number of frequency tuning cells of the DCO 1020 activated/deactivated to reach an expected frequency deviation for the output oscillating signal S_out. Since the DCO 1020 can be adjusted by the first control signal S_c1 in a digital form, an additional digital to analog converter (DAC) for converting the modulating data MD to an analog form is not necessary, and hence a simpler, low cost and low power modulation circuit can be realized.

The phase frequency detector 104 receives the reference signal S_ref and a divided signal S_d from the frequency divider 110 to detect a phase difference between the reference signal S_ref and the divided signal S_d. The frequency divider 110 receives the output oscillating signal S_out and generates the divided signal S_d in response to the output oscillating signal S_out and the second control signal S_c2. In one embodiment, the phase frequency detector 104 compares the reference signal S_ref with the divided signal S_d to enable the charge pump 106 in response to a phase difference between the reference signal S_ref and the divided signal S_d. When the phase difference reaches zero, the PLL circuit 100 enters a phase-locked state.

The charge pump 106 is coupled to the output of the phase frequency detector 104 to generate an amount of charge proportional to the phase difference between the reference signal S_ref and a divided signal S_d.

The loop filter 108, coupled to the charge pump 106, outputs the filtered signal S_f in response to the detected phase difference. In an embodiment, the loop filter 108 filters signals obtained from the charge pump 106 to generate the filtered signal S_f, and the oscillating module 102 may respond to the received filtered signal S_f to control the oscillation of the VCO 1022.

The frequency divider 110, coupled to the oscillating module 102 and the phase frequency detector 104, is configured to divide frequency of the output oscillating signal S_out by a divider value (e.g., N) to generate the divided signal S_d. By changing the divider value dynamically, the average of the division becomes a fractional number, and the equivalent frequency of the output oscillating signal S_out is given by Fo=Fr*N.F, where Fr is the frequency of the reference signal S_ref and F is the fractional part of the divider value. Thus, with a modulation of the divider value, the frequency of the output oscillating signal S_out can be adjusted.

Figure 2:
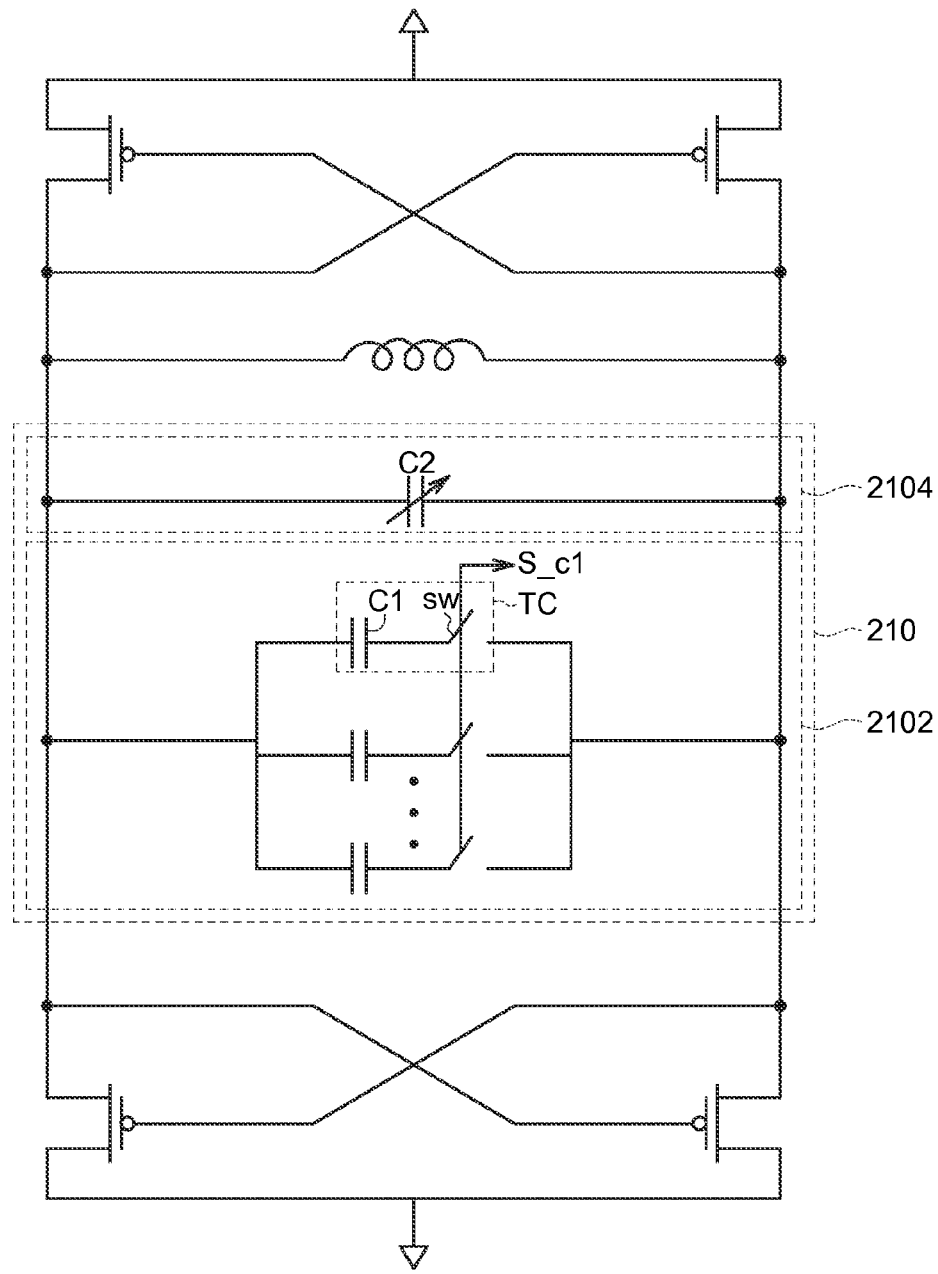
FIG. 2 illustrates an oscillating module according to an embodiment of the present disclosure.

FIG. 2 illustrates an exemplary circuit diagram of the oscillating module 102. The oscillating module 102 includes a LC (inductor, capacitor) resonant tank 210 that includes a digital controlled capacitor bank 2102 for the DCO 1020 and a voltage tuning capacitor bank 2104 for the VCO 1022. The digital controlled capacitor bank 2102 includes a plurality of frequency tuning cells TC that each of which includes one or more capacitors C1 and one or more switches SW. In response the first control signal S_c1, each switch SW is selectively switched on/off, and hence the capacitance of the digital controlled capacitor bank 2102 is changed. In such instance, the estimated tuning gain of the oscillating module 102 is directed to an estimated amount of frequency deviation that results from switching on/off one frequency tuning cell TC of the DCO 1020.

The voltage tuning capacitor bank 2104 includes one or more varactors C2 whose capacitance is controlled by the filtered signal S_f. The total resonant capacitance of the LC resonant tank 210 of the oscillating module 102 can be divided into two parts: the first part is determined by the first control signal S_c1, and the second part is determined by the filtered signal S_f, wherein the change of the former is dominated by the modulating data MD, while the change of the latter is dominated by the phase difference between the output oscillating signal S_out and the reference signal S_ref. Note that the oscillator architecture shown in FIG. 2 is just one way of implementing the present disclosure. It is given for illustration purposes, not for restriction purposes, as the oscillator can be implemented in many different ways as long as the oscillator includes a capacitor bank whose capacitance is changed in response to the modulating data.

The abovementioned estimated tuning gain may vary in response to the operating frequency, temperature and/or process variation. Furthermore, when the estimated tuning gain is larger or smaller than that at the path for the second input of the PLL circuit (e.g., the gain for the SDM), the frequency response may severely deteriorate the output oscillating signal. Therefore, in some cases, gain calibration is required to compensate for the variations.

Figure 3:
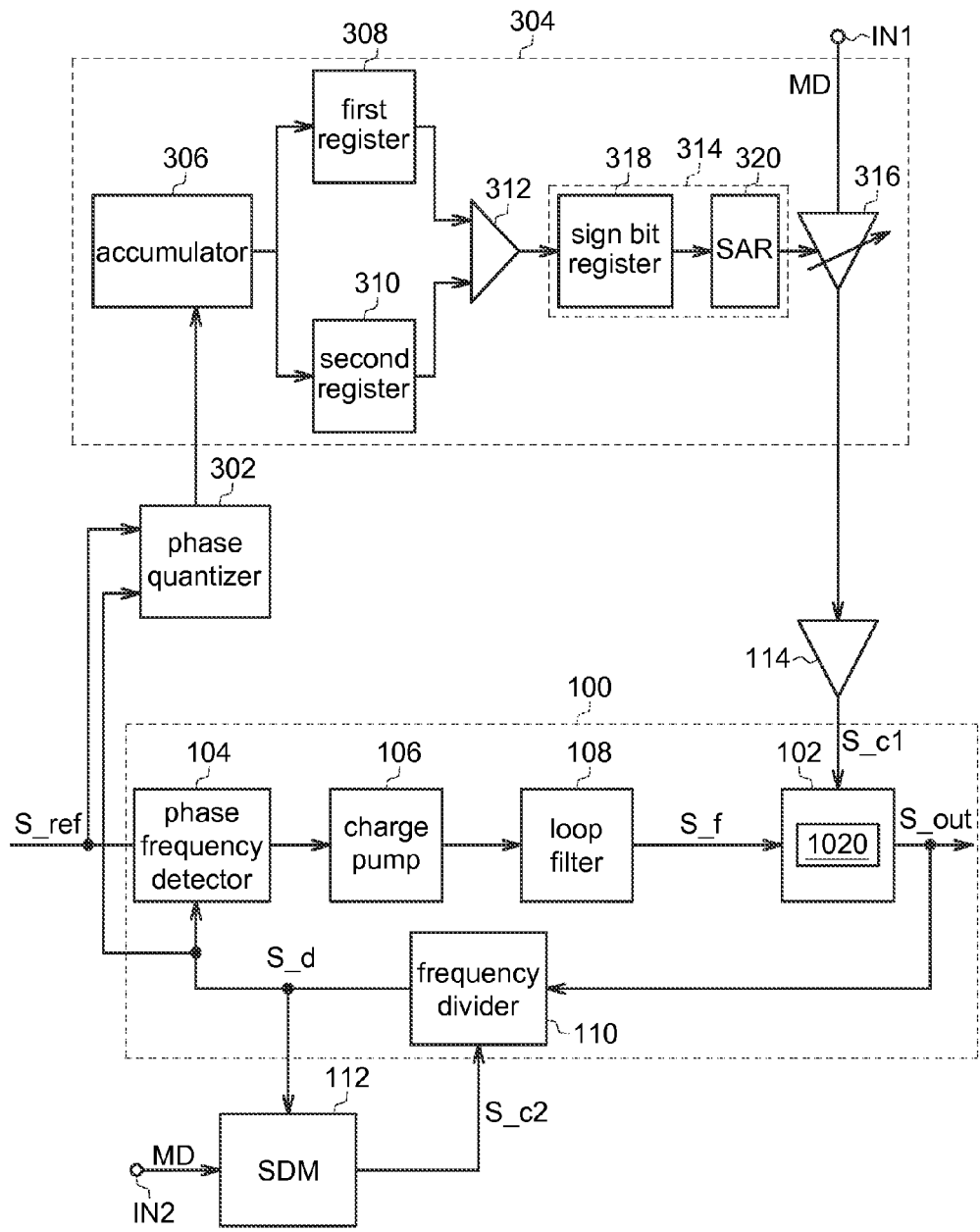
FIG. 3 illustrates a modulation circuit having gain calibration capability according an embodiment of the present disclosure.

FIG. 3 illustrates a modulation circuit 30 having gain calibration capability according an embodiment of the present disclosure. The modulation circuit 30 further comprises a phase quantizer 302 and a calibration circuit 304.

The phase quantizer 302 is configured to quantize the phase difference information between reference signal S_ref and divided signal S_d and generate quantized phase difference information in digital format accordingly. The phase quantizer 302 can be implemented by a time-to-digital converter (TDC) or other type of phase quantizer.

The calibration circuit 304, coupled to the phase quantizer 302, receives the quantized phase difference information in digital format. The calibration circuit 304 accumulates the quantized phase difference information during a first time interval to obtain a first accumulated result, accumulates the quantized phase difference information during a second time interval to obtain a second accumulated result and calibrates the estimated tuning gain in response to a comparison result of the first accumulated result and the second accumulated result.

The calibration circuit 304 includes an accumulator 306, a first register 308, a second register 310, a comparator 312, a gain searching circuit 314 and a gain compensator 316. The accumulator 306, coupled to the phase quantizer 302, accumulates the quantized phase difference information during the first time interval to generate the first accumulated result, and accumulate the quantized phase difference information during the second time interval to generate the second accumulated result. In one embodiment, lengths of the first time interval and the second time interval (i.e., the integration time) are equal.

In an embodiment, the accumulator 306 generates the first and second accumulated results by integrating the quantized phase difference information during the first and second time intervals, respectively. For example, the PLL circuit 100 is settling (not yet phase-locked) during the first time interval and is settled (phase-locked) during the second time interval. In such instance, the first accumulated result includes a static phase error and a dynamic phase error, while the second accumulated result includes the static phase error only. The static phase error may occur due to the current mismatch of the charge pump 106 and/or the static current in the charge pump 106 when the PLL circuit 100 operates in the phased-locked state. The dynamic phase error may occur due to the mismatch of the estimated tuning gain of the oscillating module 102. Accordingly, to avoid a wrong calibration result of the estimated tuning gain due to the introduction of the static phase error in the calibration, a comparison result between the first and second accumulated results is used in the following gain calibration procedure.

As shown in FIG. 3, the first register 308 is configured to store the first accumulated result, and the second register 310 is configured to store the second accumulated result. The comparator 312, coupled to the first register 308 and the second register 310, compares the magnitude of the first accumulated result with the magnitude of the second accumulated result to generate the comparison result. The comparator 312 can be a 1-bit comparator, a subtracter or any other device capable of outputting difference information between two signals. The gain searching circuit 314, coupled to the comparator 312 and the gain compensator 316, receives the comparison result and adjusts the gain of the gain compensator 316 according to the comparison result. The adjusted gain is used as a calibration gain for the modulating data MD. As shown in FIG. 3, the gain compensator 316, coupled to the scalar circuit 114, may modify the modulating data MD received from the first input IN1 with the calibration gain to mitigate/minimalize the mismatch of the estimated tuning gain of the oscillating module 102.

In the example of FIG. 3, the gain searching circuit 314 comprises a sign bit register 318 and a successive approximation register (SAR) 320. The sign bit register 318 is used to store a sign bit of the comparison result between the first and second accumulated results. For example, if the magnitude of the first accumulated result is larger than that of the second accumulated result, the sign bit (e.g., 1) may have a first value that indicates the comparison result is positive. If the magnitude of the first accumulated result is less than that of the second accumulated result, the sign bit may have a second value (e.g., 0) that indicates the comparison result is negative. Then, the SAR 320 adjusts the calibration gain according to the sign bit. For example, the SAR 320 employs a successive approximation algorithm to find the optimal calibration gain of the gain compensator 316, such that the dynamic phase error is eliminated or minimized.

Figure 4:
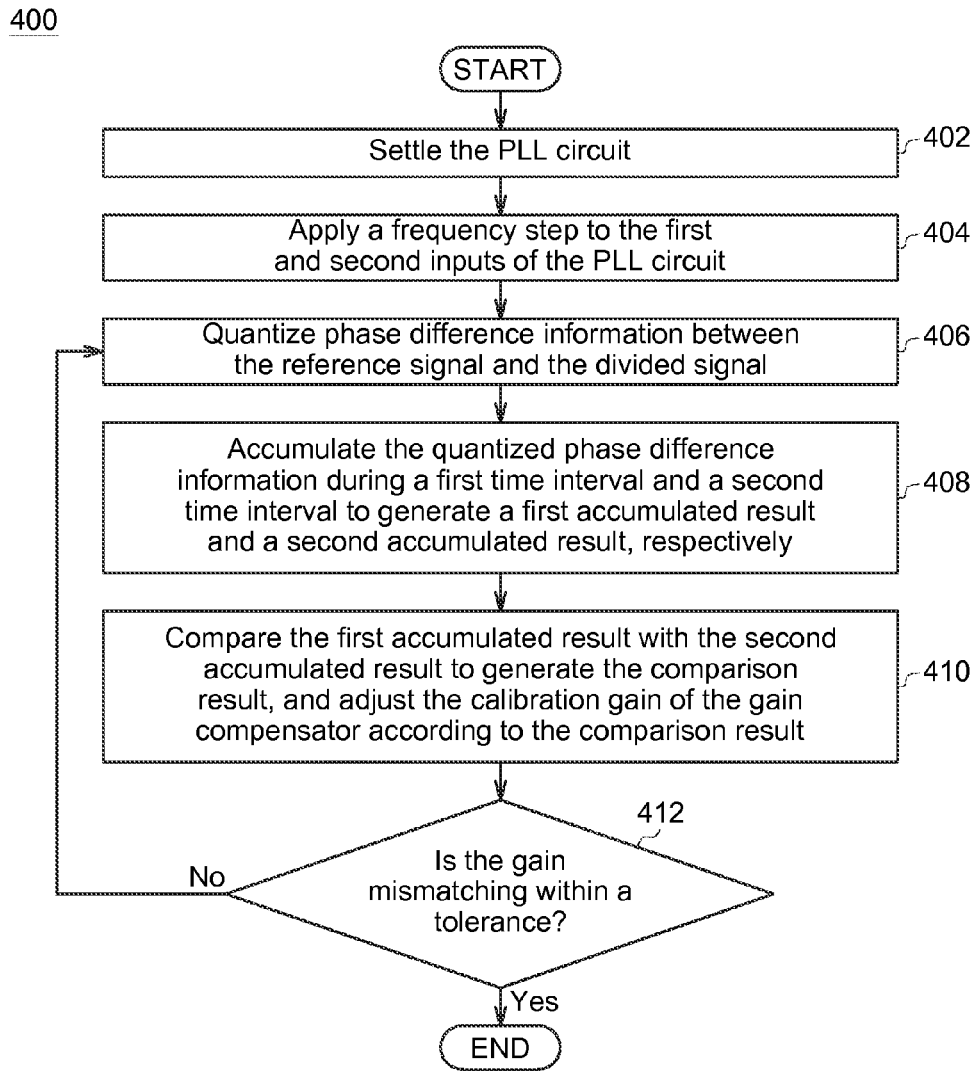
FIG. 4 illustrates a flowchart of an operating method for calibrating gain mismatching of the modulation circuit according to an embodiment of the present disclosure.

FIG. 4 illustrates a flowchart 400 of an operating method for calibrating gain mismatch of the modulation circuit 30 according to an embodiment of the present disclosure. At first, the PLL circuit 100 of the modulation circuit 30 is settled (e.g., locked to a carrier frequency) (step 402). Then, a frequency step is applied to the first input IN1 and the second input IN2 of the PLL circuit 100 (step 404). In response to the applied frequency step, the phase quantizer 302 quantizes the phase difference information between reference signal S_ref and divided signal S_d to generate quantized phase difference information in digital format accordingly (step 406). And, the calibration circuit 304 accumulates the quantized phase difference information during a first time interval to generate a first accumulated result, accumulates the quantized phase difference information during a second time interval to generate a second accumulated result (step 408), compares the first accumulated result with the second accumulated result to generate the comparison result, and adjusts the calibration gain of the gain compensator 316 according to the comparison result (step 410). In one embodiment, based on SAR searching algorithm, the adjusting step is performed iteratively until the gain mismatching is within a tolerance (step 412).

As a brief summary of flowchart 400, the basis of the calibration is the gain at the path of second input IN2 (SDM path). If there is a gain mismatch between the two input paths of the PLL circuit 100, the calibration circuit 304 may adjust the gain at the path of first input IN1 to eliminate the dynamic phase error.

Figure 5:
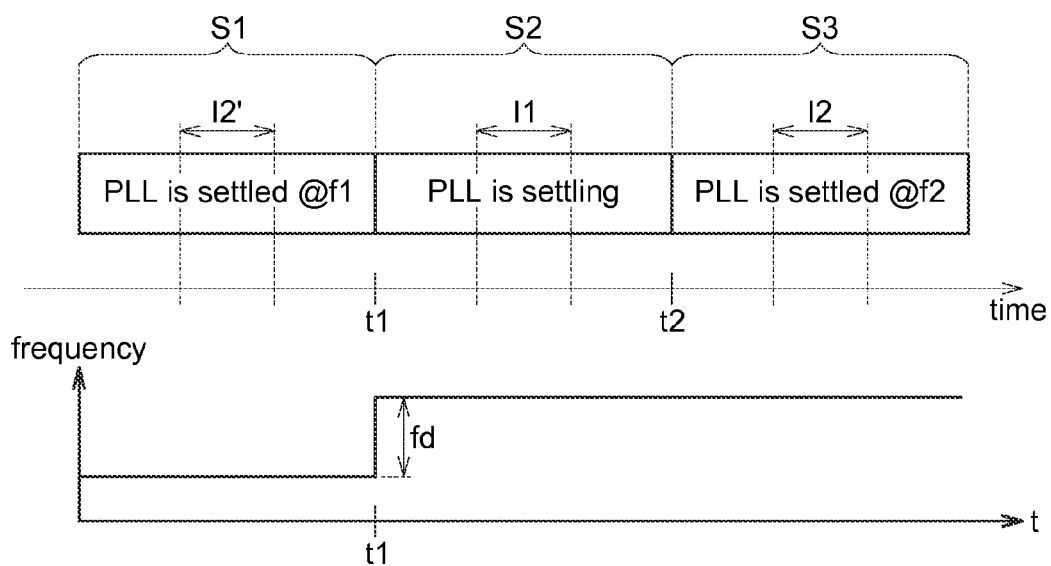
FIG. 5 is an exemplary timing diagram illustrating different stages of a PLL circuit during the gain calibration.

FIG. 5 is an exemplary timing diagram illustrating different stages S1-S3 of a PLL circuit during the gain calibration. At first, the PLL circuit is settled at frequency f1 (stage S1). Then, at timing t1, a frequency step fd is injected to the first and second inputs of the PLL circuit, such that the PLL circuit begins to settle to a new frequency corresponding to the frequency step fd (stage S2). After timing t2, the PLL circuit completes phase-locking, and is settled at frequency f2 (stage S3).

The accumulator of the calibration circuit may generate the first and second accumulated results by accumulating the phase difference information during the PLL circuit is setting and settled, respectively. As shown in FIG. 5, in an embodiment, the first time interval I1 is a period of time in stage S2 that the PLL circuit is setting in response to the injection of the frequency step fd, and the second time interval I2 is a period of time in stage S3 that the PLL circuit is settled when the frequency step fd is applied. Note that the first and second time intervals I1 and I2 should be with the same time lengths.

In another embodiment, the first time interval is I1, while the second time interval I2' is another period of time in stage S1 that the PLL circuit is settled before the frequency step fd is applied. Similarly, the first and second time intervals I1 and I2' should be with the same time lengths. The first accumulated result corresponding to the first time interval I1 may include both the static phase error and the dynamic phase error, while the second accumulated result corresponding to the second time interval I2' may include the static phase error only.

Figure 6:
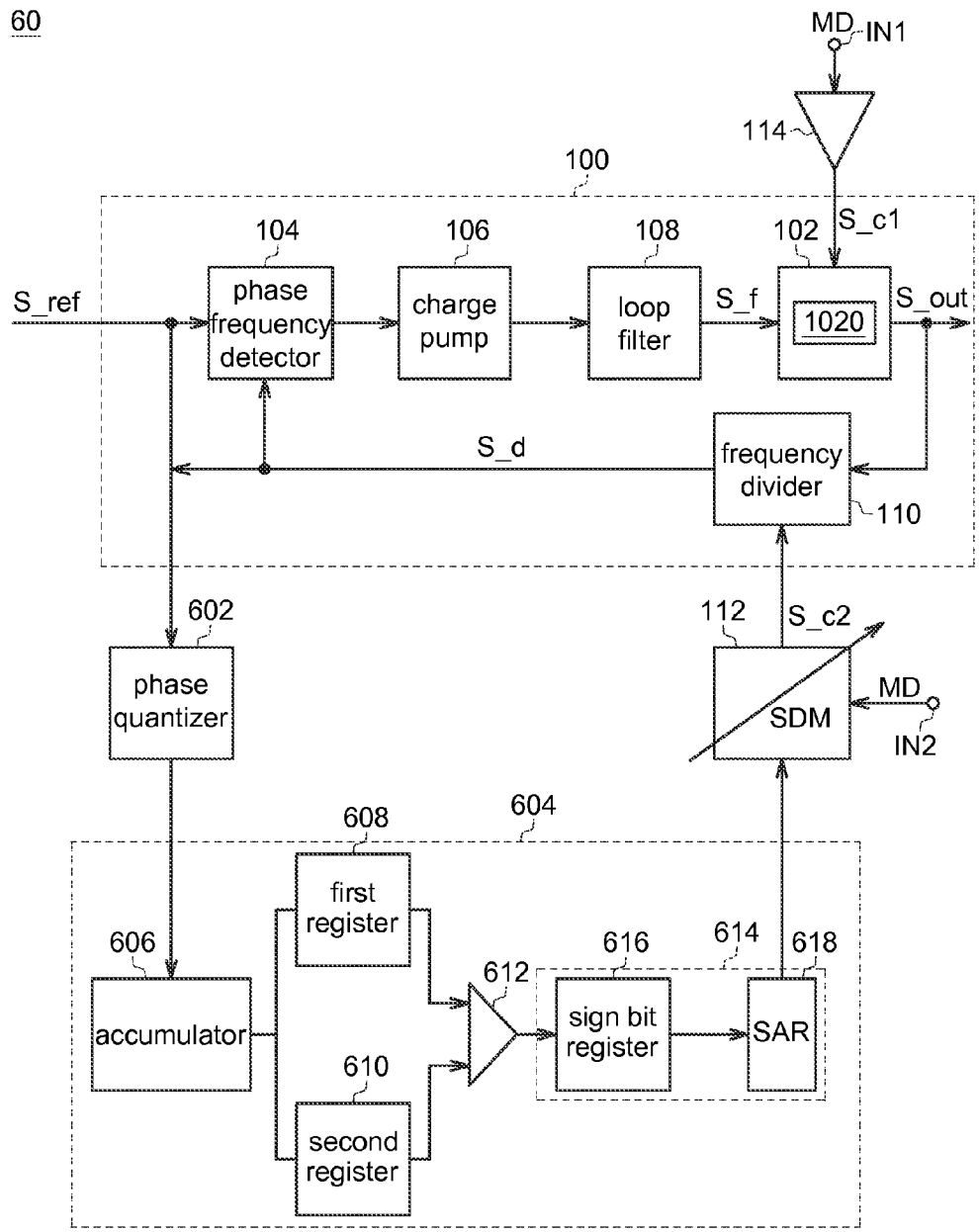
FIG. 6 illustrates a modulation circuit according another embodiment of the present disclosure.

FIG. 6 illustrates a modulation circuit 60 according another embodiment of the present disclosure. In this embodiment, the calibration circuit 604 of the modulation circuit 60 is coupled to the path at the second input IN2 (SDM path) of the modulation circuit 60.

As shown in FIG. 6, the modulation circuit 60 includes a PLL circuit 100, a SDM 112, a scalar circuit 114, a phase quantizer 602 and a calibration circuit 604. The phase quantizer 602 quantizes the phase difference information between reference signal S_ref and divided signal S_d.

The calibration circuit 604, coupled to the phase quantizer 602, includes an accumulator 606 for accumulating the quantized phase difference information, a first register 608 for storing a first accumulated result, a second register 610 for storing a second accumulated result, a comparator 612 for comparing the first accumulated result with the second accumulated result to generate a comparison result, and a gain searching circuit 614 for receiving the comparison result to adjust the modulating data MD at the second input IN2 (i.e., the SDM path for the PLL circuit 100). In the example of FIG. 6, the gain searching circuit 614 includes a sign bit register 616 and a SAR 618. The sign bit register 616 stores a sign bit of the comparison result, and the SAR 618 adjusts the modulating data MD at the second input IN2 according to the sign bit.

Figure 7:
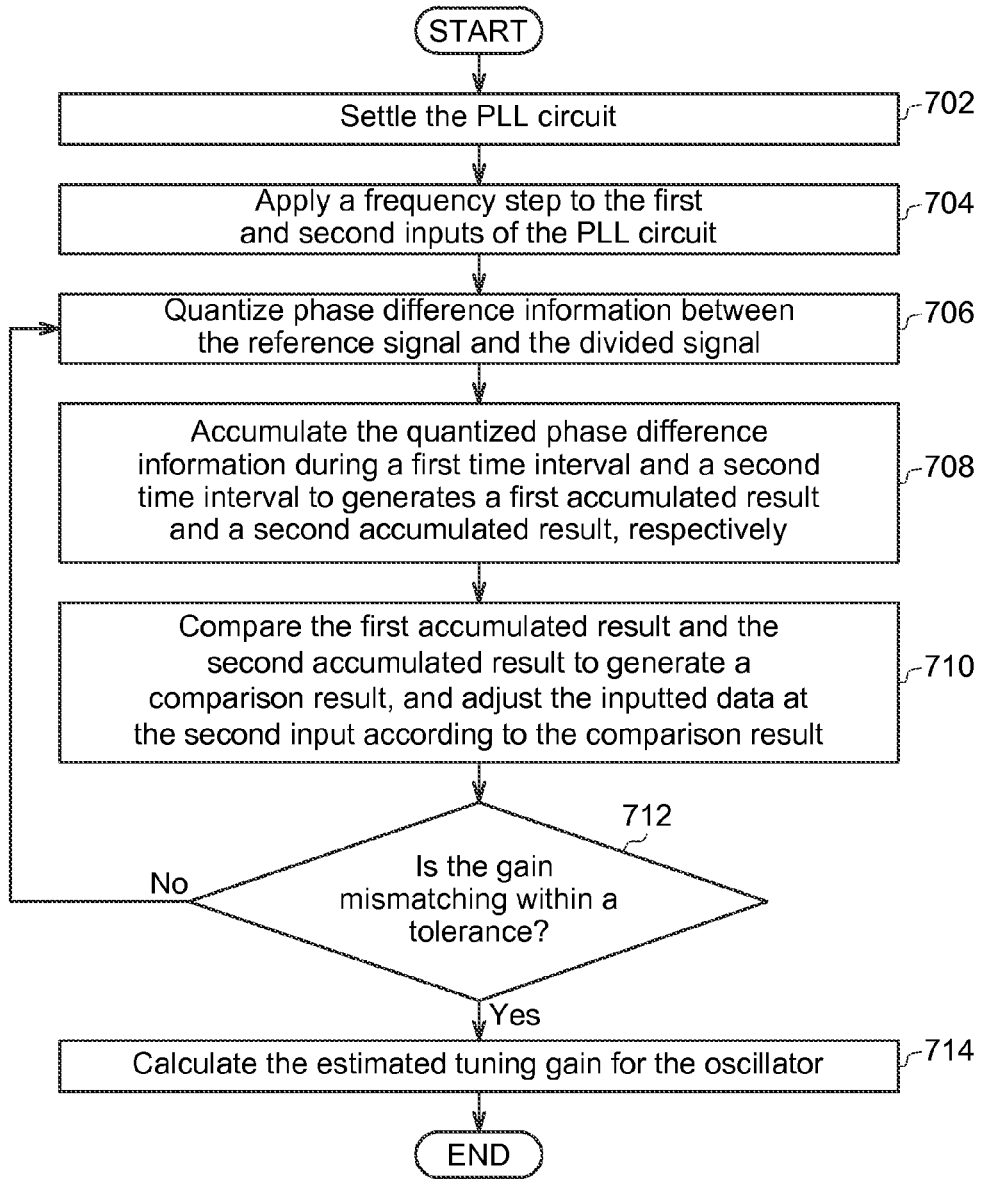
FIG. 7 illustrates a flowchart of an operating method for calibrating gain mismatching of the modulation circuit according to an embodiment of the present disclosure.

FIG. 7 illustrates a flowchart 700 of an operating method for calibrating gain mismatching of the modulation circuit 60 according to an embodiment of the present disclosure. At first, the PLL circuit 100 is settled (step 702). Then, a frequency step is applied to the first input IN1 and the second input IN2 of the PLL circuit 100 (step 704). For example, N frequency tuning cells TC of the digital controlled capacitor 1020 may be activated/deactivated to generate the frequency step at the first input IN1, and for the path of the second input IN2, the frequency step is equal to N*Kd.

In response to the frequency step, the phase quantizer 602 quantizes the phase difference information between reference signal S_ref and divided signal S_d to generate quantized phase difference information in digital format accordingly (step 706). The calibration circuit 604 accumulates the quantized phase difference information during a first time interval to generate a first accumulated result and accumulates the quantized phase difference information during a second time interval to generate a second accumulated result, respectively (step 708), compares the first accumulated result and the second accumulated result to generate a comparison result, and adjusts the inputted data at the second input IN2 according to the comparison result (step 710). In one embodiment, based on SAR searching algorithm, the steps may be performed iteratively until the gain mismatching is within a tolerance (step 712). When the PLL circuit 100 is settled, a calibrated estimated tuning gain for the oscillating module 102 can be calculated by Fsdm_final/N (step 714), where Fsdm_final is a frequency step value for the SDM path when the PLL circuit 100 is settled.

As a brief summary of flowchart 700, the basis of the calibration is the gain at the path of first input IN1. If there is a gain mismatch between the two input paths of the PLL circuit 100, the calibration circuit 604 may adjust the input data at the second input IN2 to eliminate the dynamic phase error, and the calibrated estimated tuning gain for the oscillating module 102 can then be derived from the frequency step value for the SDM path when the PLL circuit 100 is settled.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A modulation circuit, comprising:
   a phase locked loop (PLL) circuit, for generating an output oscillating signal in response to a reference signal, a first control signal and a second control signal, the PLL circuit comprises:
   a phase frequency detector, for detecting a phase difference between the reference signal and a divided signal;
   a charge pump coupled to the phase frequency detector;
   a loop filter, coupled to the charge pump, for outputting a filtered signal in response to the phase difference;
   an oscillating module, for generating the output oscillating signal in response to the filtered signal and the first control signal, comprising:
   a digital controlled capacitor bank, wherein the first control signal controls the capacitance of the digital controlled capacitor bank to adjust a frequency of the output oscillating signal; and
   voltage tuning capacitor bank, for performing phase-locking in response to the filtered signal; and
   the frequency divider, coupled to the oscillating module and the phase frequency detector, for dividing the frequency of the output oscillating signal by the divider value to generate the divided signal;
   a scalar circuit, coupled to the PLL circuit, for receiving modulating data and generating the first control signal in response to the modulating data to control frequency deviation of the output oscillating signal, wherein the first control signal is in a digital form;
   a sigma-delta modulator for receiving the same modulating data and generating the second control signal according to the modulating data to modulate a divider value of a frequency divider of the PLL circuit;
   a phase quantizer, for quantizing the phase difference information between reference signal and divided signal to generate quantized phase difference information in digital format; and
   a calibration circuit, coupled to the phase quantizer, for calibrating an estimated tuning gain of the oscillating module in response to the quantized phase difference information.

2. The modulation circuit according to claim 1, wherein the digital controlled capacitor bank comprises:
   a plurality of frequency tuning cells that each of which comprises a capacitor and a switch;
   wherein the first control signal indicates an estimated tuning gain of the oscillating module, and the estimated tuning gain represents an estimated amount of frequency deviation that results from a unit-cell-change in the digital controlled capacitor bank.

3. The modulation circuit according to claim 1, wherein the calibration circuit comprises:
   an accumulator, coupled to the phase quantizer, for accumulating the quantized phase difference information during a first time interval to obtain a first accumulated result and accumulating the quantized phase difference information during a second time interval to obtain a second accumulated result;
   a first register, for storing the first accumulated result;
   a second register, for storing the second accumulated result;
   a comparator, coupled to the first register and the second register, for comparing the magnitude of the first accumulated result with the magnitude of the second accumulated result to generate a comparison result;
   a gain compensator, coupled to the scalar circuit, for modifying the modulating data with a calibration gain; and
   a gain searching circuit, coupled to the comparator and the gain compensator, for adjusting the calibration gain in response to the comparison result.

4. The modulation circuit according to claim 3, wherein the gain searching circuit comprises:
   a sign bit register, for storing a sign bit of the comparison result; and
   a successive approximation register (SAR), for adjusting the calibration gain according to the sign bit.

5. The modulation circuit according to claim 3, wherein the first time interval is a period of time that the PLL circuit is setting when a frequency step is applied to the PLL circuit via the first input and the second input, and the second time interval is another period of time that the PLL circuit is settled before the frequency step is applied to the PLL circuit.

6. The modulation circuit according to claim 3, wherein the first time interval is a period of time that the PLL circuit is setting when a frequency step is applied to the PLL circuit via the first input and the second input, and the second time interval is another period of time that the PLL circuit is settled when the frequency step is applied to the PLL circuit.

7. The modulation circuit according to claim 3, wherein lengths of the first time interval and the second time interval are equal.

8. The modulation circuit according to claim 1, wherein the calibration circuit comprises:
   an accumulator, coupled to the detector, for accumulating the quantized phase difference information during the first time interval to generate the first accumulated result, and accumulating the quantized phase difference information during the second time interval to generate the second accumulated result;
   a first register, for storing the first accumulated result;
   a second register, for storing the second accumulated result;
   a comparator, coupled to the first register and the second register, for comparing a magnitude of the first accumulated result with a magnitude of the second accumulated result to generate a comparison result; and
   a gain searching circuit, coupled to the comparator, for adjusting the modulating data in response to the comparison result.

9. The modulation circuit according to claim 8, wherein the gain searching circuit comprises:
   a sign bit register, for storing a sign bit of the comparison result of the first accumulated result and the second accumulated result; and
   a SAR, for adjusting the modulating data according to the sign bit.

10. An operating method of a modulation circuit comprising a phase quantizer and a calibration circuit, comprising:
    generating, by a phase locked loop (PLL) circuit, an output oscillating signal in response to a reference signal, a first control signal and a second control signal, wherein the PLL circuit comprises a phase frequency detector, a charge pump, a loop filter, an oscillating module and the frequency divider;
    receiving modulating data and generating, by a scalar circuit coupled to the PLL circuit, the first control signal in response to the modulating data to control frequency deviation of the output oscillating signal, wherein the first control signal is in a digital form;
    receiving the same modulating data and generating, by a sigma-delta modulator coupled to the PLL circuit, the second control signal according to the modulating data to modulate a divider value of a frequency divider of the PLL circuit;
    detecting, by the phase frequency detector, a phase difference between the reference signal and a divided signal;
    outputting, by the loop filter, a filtered signal in response to the phase difference;
    generating, by the oscillating module, the output oscillating signal in response to the filtered signal and the first control signal;
    dividing, by the frequency divider, the frequency of the output oscillating signal by the divider value to generate the divided signal;
    wherein the oscillating module comprises a digital controlled capacitor bank and a voltage tuning capacitor bank, the first control signal controls the capacitance of the digital controlled capacitor bank to adjust a frequency of the output oscillating signal, and the voltage tuning capacitor bank performs phase-locking in response to the filtered signal;
    quantizing, by the phase quantizer, the phase difference information between reference signal and divided signal to generate quantized phase difference information in digital format; and
    calibrating, by the calibration circuit, an estimated tuning gain of the oscillating module in response to the quantized phase difference information.

11. The operating method according to claim 10, wherein the digital controlled capacitor bank comprises:
    a plurality of frequency tuning cells that each of which comprises a capacitor and a switch;
    wherein the first control signal indicates an estimated tuning gain of the oscillating module, and the estimated tuning gain represents an estimated amount of frequency deviation that results from a unit-cell-change in the digital controlled capacitor bank.

12. The operating method according to claim 10, wherein the calibration circuit comprises an accumulator, a first register, a second register, a comparator, a gain compensator, and a gain searching circuit, and the operating method further comprises:
    accumulating, by the accumulator, the quantized phase difference information during a first time interval to obtain a first accumulated result and accumulating the quantized phase difference information during a second time interval to obtain a second accumulated result;
    storing, by the first register, the first accumulated result;
    storing, by the second register, the second accumulated result;
    comparing, by the comparator, the magnitude of the first accumulated result with the magnitude of the second accumulated result to generate a comparison result;
    modifying, by the gain compensator, the modulating data with a calibration gain; and
    adjusting, by the gain searching circuit, the calibration gain in response to the comparison result.

13. The operating method according to claim 12, wherein the gain searching circuit comprises a sign bit register and a successive approximation register (SAR), and the operating method further comprises:
    storing, by the sign bit register, a sign bit of the comparison result; and
    adjusting, by the SAR, the calibration gain according to the sign bit.

14. The operating method according to claim 12, wherein the first time interval is a period of time that the PLL circuit is setting when a frequency step is applied to the PLL circuit via the first input and the second input, and the second time interval is another period of time that the PLL circuit is settled before the frequency step is applied to the PLL circuit.

15. The operating method according to claim 12, wherein the first time interval is a period of time that the PLL circuit is setting when a frequency step is applied to the PLL circuit via the first input and the second input, and the second time interval is another period of time that the PLL circuit is settled when the frequency step is applied to the PLL circuit.

16. The operating method according to claim 12, wherein lengths of the first time interval and the second time interval are equal.

17. The operating method according to claim 10, wherein the calibration circuit comprises an accumulator, a first register, a second register, a comparator and a gain searching circuit, and the operating method further comprises:
    accumulating, by the accumulator, the quantized phase difference information during the first time interval to generate the first accumulated result, and accumulating the quantized phase difference information during the second time interval to generate the second accumulated result;

storing, by the first register, the first accumulated result;

storing, by the second register, the second accumulated result;

comparing, by the comparator, a magnitude of the first accumulated result with a magnitude of the second accumulated result to generate a comparison result; and adjusting, by the gain searching circuit, the modulating data in response to the comparison result.

18. The operating method according to claim 17, wherein the gain searching circuit comprises a sign bit register and a SAR, and the operating method further comprises:

storing, by the sign bit register, a sign bit of the comparison result of the first accumulated result and the second accumulated result; and adjusting, by the SAR, the modulating data according to the sign bit.

19. An operating method of a modulation circuit, comprising:

generating, by a phase locked loop (PLL) circuit, an output oscillating signal in response to a reference signal, a first control signal and a second control signal;

receiving modulating data and generating, by a scalar circuit coupled to the PLL circuit, the first control signal in response to the modulating data to control frequency deviation of the output oscillating signal, wherein the first control signal is in a digital form:

receiving the same modulating data and generating, by a sigma-delta modulator coupled to the PLL circuit, the second control signal according to the modulating data to modulate a divider value of a frequency divider of the PLL circuit;

applying a frequency step to the PLL circuit;

quantizing phase difference information indicating a phase difference between the reference signal and the divided signal;

accumulating the phase difference information during a first time interval and a second time interval to obtain a first accumulated result and a second accumulated result, respectively; and calibrating an estimated tuning gain for an oscillating module of the PLL circuit according to a comparison result of the first accumulated result and the second accumulated result, wherein the oscillating module comprises a capacitor bank whose capacitance is adjusted in response to the frequency step.

* * * * *